US007050296B2

United States Patent
Liao

(10) Patent No.: US 7,050,296 B2
(45) Date of Patent: May 23, 2006

(54) RETAINING DEVICE FOR EXPANSION CARDS

(75) Inventor: Nien-Chiang Liao, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 604 days.

(21) Appl. No.: 10/323,177

(22) Filed: Dec. 17, 2002

(65) Prior Publication Data

US 2004/0037048 A1 Feb. 26, 2004

(30) Foreign Application Priority Data

Aug. 23, 2002 (TW) ....................... 91213118 U

(51) Int. Cl.
*G06F 1/16* (2006.01)

(52) U.S. Cl. ................ 361/685; 361/801; 439/384; 360/98.01

(58) Field of Classification Search ......... 361/680–687, 361/801, 724–727; 439/377, 384–385; 360/98.08, 360/98.01; 318/471
See application file for complete search history.

(56) References Cited

U.S. PATENT DOCUMENTS

| 6,381,139 | B1 | * | 4/2002 | Sun ........................... 361/725 |
| 6,490,153 | B1 | * | 12/2002 | Casebolt et al. ............ 361/685 |
| 6,608,750 | B1 | * | 8/2003 | Cruz et al. .................. 361/685 |
| 6,608,765 | B1 | * | 8/2003 | Vier et al. ................... 361/801 |

* cited by examiner

*Primary Examiner*—Hung Van Duong
(74) *Attorney, Agent, or Firm*—Wei Te Chung

(57) ABSTRACT

A retaining device for expansion cards includes a retaining bracket (3) and a computer rear panel (4). The retaining bracket includes a pressing body (32), two operating arms (34) extending from respective opposite ends of the pressing body, and two pairs of pivots (36). Each operating arm has a resilient pressing finger (346), and a locking detent (348) formed at a distal end of the pressing finger. The rear panel includes a first plate (40), and a second plate (42) defining two openings (44). The pivots of the retaining bracket are pivotably mounted to the second plate of the rear panel. The retaining bracket sandwiches a slot cover (11) of each expansion card with the first plate. The locking detents are snappingly engaged with the second plate in the openings.

18 Claims, 3 Drawing Sheets

RETAINING DEVICE FOR EXPANSION CARDS

BACKGROUND OF THE INVENTION

1. Field of the Invention

The present invention relates to retaining devices, and more particularly to a retaining device which has a retaining bracket readily and securely retaining expansion cards in a computer enclosure.

2. Description of the Related Art

Personal computer systems typically include a motherboard for mounting at least one microprocessor and other application specific integrated circuits (ASICs) such as memory controllers, input/output (I/O) controllers and the like. Most motherboards provide slots for additional adapter cards to provide additional function to the computer system. Typical functions that a user might add to a computer include additional memory, sound cards, graphics cards, and the like. The slots provided on the motherboard generally include in-line electrical connectors having electrically conductive fingers which receive exposed tabs on the adapter cards. The fingers are connected to wiring layers, which in turn are connected to a bus that allows the cards to communicate with the microprocessor or other components in the system. Typical adapter cards used have an L-shaped slot cover, and are installed at suitable ports of a rear panel of an enclosure of a personal computer (PC) using screws. However, when the PC is manufactured, installed or maintained, it is inconvenient and unduly time-consuming to tighten and/or loosen the screws to mount the cards in and/or take the cards out from the rear panel. In addition, screws may be lost during such procedures.

A retaining device without screws is disclosed in the China patent No. 01227393. The retaining device has a cover board pivotably attached in the rear panel, and a locking unit for locking the cover board to the rear panel. When locked, the cover board presses the slot covers of the cards onto the rear panel. The retaining device comprises numerous parts such as the cover board, a pivot, a locking unit, and so on. The structure of the retaining device is unduly complex and costly. In addition, many of the parts need to cooperatively function. After extended use, the parts are prone to wear and build up large tolerances. This reduces the reliability of the assembly incorporating the retaining device.

SUMMARY OF THE INVENTION

Accordingly, an object of the present invention is to provide a retaining device which can readily and securely attach cards in a computer enclosure.

To achieve the above object, a retaining device for expansion cards in accordance with a preferred embodiment of the present invention comprises a retaining bracket and a computer rear panel. The retaining bracket includes a pressing body, two operating arms extending from respective opposite ends of the pressing body, and two pairs of pivots. Each operating arm has a resilient pressing finger, and a locking detent formed at a distal end of the pressing finger. Each pair of pivots is formed at a junction of the pressing body and a respective one of the operating arms. The rear panel comprises a first plate, and a second plate extending perpendicularly from the first plate. The second plate defines two first openings in respective opposite end portions thereof, and two second openings respectively below the first openings. Two protrusions extend inwardly at respective opposite sides of each second opening. Each protrusion defines a pivot hole for receiving a corresponding pivot of the retaining bracket. The pressing body of the retaining bracket and the first plate sandwich a slot cover of each expansion card therebetween. In assembly, the operating arms are rotated in the first openings until the locking detents are snappingly engaged with the second plate in the first openings.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
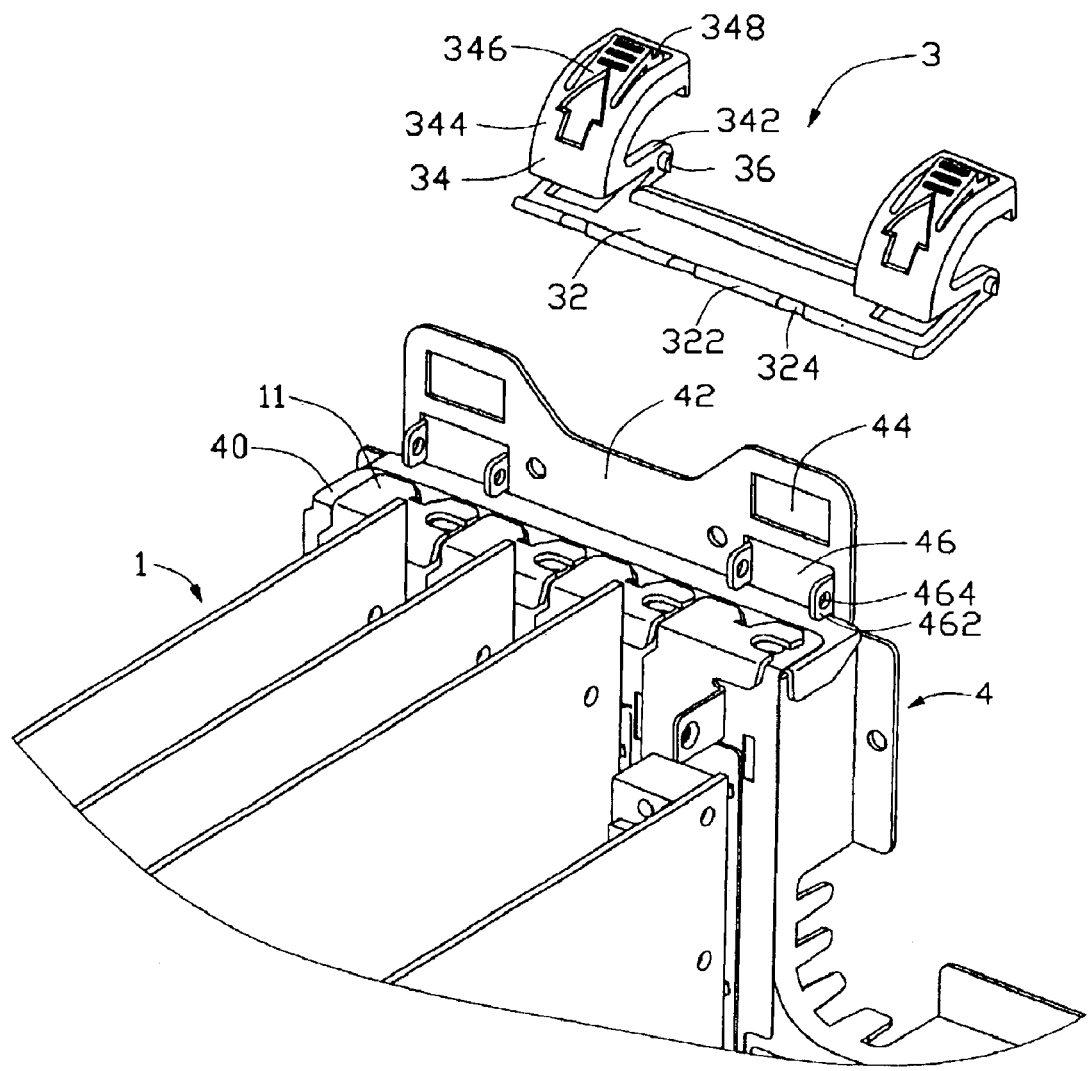
FIG. 1 is an exploded isometric view of a retaining device in accordance with a preferred embodiment of the present invention, together with a plurality of expansion cards.

Referring to FIG. 1, a retaining device in accordance with a preferred embodiment of the present invention comprises a retaining bracket 3 and a computer rear panel 4. The retaining device is used to mount a plurality of expansion cards 1 in slots (not shown) defined in a motherboard (not shown) of a computer enclosure (not shown). Each expansion card 1 comprises a slot cover 11 at an end thereof.

The retaining bracket 3 is integrally formed, and includes a pressing body 32 and two operating arms 34 extending from respective opposite ends of the pressing body 32. A plurality of evenly spaced notches 324 is defined in a longitudinal edge portion 322 of the pressing body 32. A pair of pivots 36 is formed at each of the junctions of the pressing body 32 and the operating arms 34. Each operating arm 34 includes a pair of parallel support bars 342 extending from the pressing body 32, and an arcuate portion 344 extending from free ends of the support bars 342. The support bars 342 extend from an edge of the pressing body 32 that is opposite to the longitudinal edge portion 322, toward the longitudinal edge portion 322 and slightly upwardly. The arcuate portions 344 extend from free ends of the support bars 342 upwardly and generally away from the longitudinal edge portion 322. A pressing finger 346 is formed at an end portion of the arcuate portion 344, and projects slightly upwardly from the arcuate portion 344. A stepped locking detent 348 is formed at a distal end of the pressing finger 346.

The rear panel 4 includes a first plate 40, and a second plate 42 extending perpendicularly from the first plate 40. A pair of first openings 44 is defined in respective opposite end portions of the second plate 42. A pair of second openings 46 is also defined in respective opposite end portions of the second plate 42, below the first openings 44. Two protrusions 462 extend perpendicularly inwardly from the second plate 42 at respective opposite sides of each second opening 46. Each protrusion 462 defines a pivot hole 464, for receiving a corresponding pivot 36 of the retaining bracket 3 therein.

Figure 2:
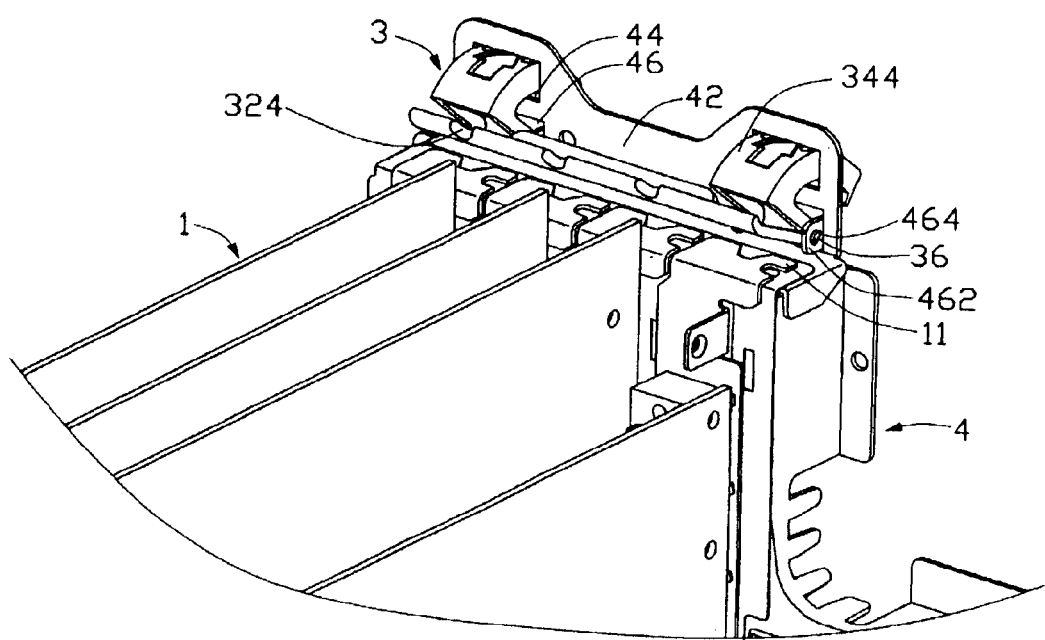
FIG. 2 is a partly assembled view of FIG. 1.
Figure 3:
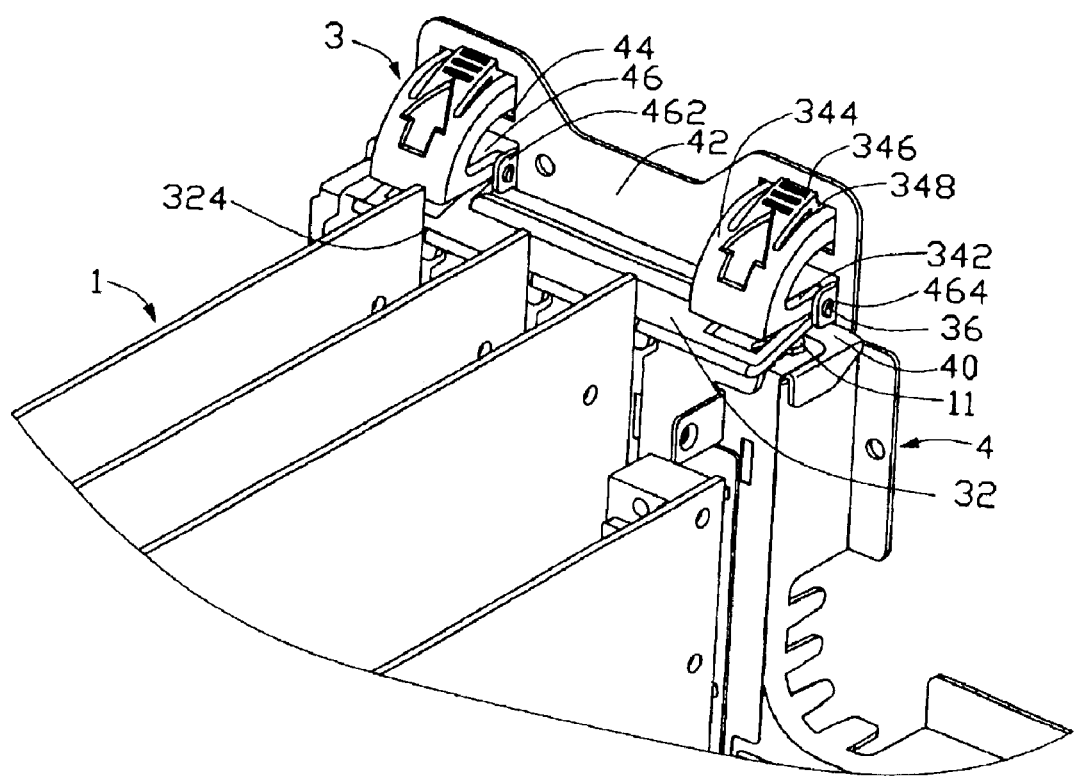
FIG. 3 is a fully assembled view of FIG. 1.

Referring to FIGS. 2 and 3, in assembly, free ends of the support bars 342 of the retaining bracket 3 are positioned adjacent the second openings 46 of the second plate 42. The pivots 36 of the retaining bracket 3 are pivotably received in the pivot holes 464 of the protrusions 462 of the second plate 42. The second openings 46 allow free pivoting of the retaining bracket 3 thereat. The pressing fingers 346 of the operating arms 34 of the retaining bracket 3 are resiliently pressed downwardly and pushed into the first openings 44 of the second plate 42. The retaining bracket 3 is rotated up and away from the first plate 40 about the pivots 36, by pulling the arcuate portions 344 through the first openings 44. The retaining bracket 3 is rotated until the pressing body 32 thereof is blocked by the second plate 42. Then the expansion cards 1 are inserted into the corresponding slots (not shown) of the motherboard (not shown) of the computer enclosure (not shown). The slot covers 11 of the expansion cards 1 are supported on the first plate 40. The operating arms 34 of the retaining bracket 3 are pushed so that the retaining bracket 3 rotates toward the first plate 40 until the pressing body 32 abuts against the slot covers 11. The pressing fingers 346 resiliently return to their original orientations, with the locking detents 348 of the operating arms 34 being snappingly received in the first openings 44. Thus free ends of the pressing fingers 346 resiliently abut the second plate 42 in the first openings 44. Edges of the expansion cards 1 are engaged with the pressing body 32 in the corresponding notches 324.

In the present invention, the pressing body 32 of the retaining bracket 3 and the first plate 40 sandwich the slot covers 11 therebetween. The expansion cards 1 are therefore not movable in vertical directions. The expansion cards 1 are engaged in the corresponding notches 324, thus preventing the expansion cards 1 from moving in horizontal directions that are parallel to the second plate 42. Friction between the pressing body 32 and the slot covers 11 helps prevent the slot covers 11 from moving in horizontal directions that are parallel to the first plate 41. Thus, the retaining device of the present invention securely retains the expansion cards 1 in the computer enclosure.

In disassembly, the pressing fingers 346 of the retaining bracket 3 are resiliently pressed downwardly and pushed into the first openings 44 of the second plate 42. The retaining bracket 3 is rotated up and away from the first plate 40, with the arcuate portions 344 being pulled through the first openings 44. The retaining bracket 3 is rotated until the pressing body 32 thereof is blocked by the second plate 42. Then the expansion cards 1 are pulled out from the slots of the motherboard.

While the present invention has been illustrated by the description of the preferred embodiment thereof, and while the embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative example shown and described.

What is claimed is:

1. A retaining device for mounting expansion cards in a computer enclosure, each card having a slot cover, the retaining device comprising:
    a rear panel comprising a first plate and a second plate extending from the first plate, the second plate defining at least one first opening;
    a retaining bracket pivotably mounted to the second plate of the rear panel, the retaining bracket comprising a pressing body for sandwiching the slot cover with the first plate, and at least an operating arm extending from the pressing body corresponding to the first opening, the at least an operating arm comprising a resilient pressing portion having a locking detent snappingly engaging with the second plate in the at least one first opening.

2. The retaining device as claimed in claim 1, wherein the second plate defines a pair of first openings located at respective opposite end portions thereof, and the retaining bracket comprises a pair of operating arms detachably engaging in the first openings respectively.

3. The retaining device as claimed in claim 1, wherein a plurality of evenly spaced notches is defined in a longitudinal edge portion of the pressing body of the retaining bracket, for engagingly receiving corresponding cards therein.

4. The retaining device as claimed in claim 1, wherein the locking detent is formed at a distal end of the pressing portion.

5. The retaining device as claimed in claim 1, wherein the locking detent is stepped.

6. The retaining device as claimed in claim 2, wherein the second plate defines a pair of second openings respectively below the first openings, a pair of protrusions is inwardly formed at respective opposite sides of each of the second openings, each of the protrusions defines a hole therein, a pair of pivots is formed at each of junctions of the pressing body and the operating arms, and the pivots are pivotably engaged in the holes.

7. The retaining device as claimed in claim 2, wherein the operating arms each comprise a pair of support bars extending from an edge of the pressing body, and an arcuate portion extending from free ends of the support bars.

8. The retaining device as claimed in claim 7, wherein the pressing portion is formed at an end of the arcuate portion, and projects slightly upwardly from the arcuate portion.

9. A retaining device assembly comprising:
    a rear panel defining at least one opening;
    an expansion card attached on the rear panel, the expansion card comprising a slot cover; and
    a retaining bracket pivotably attached to the rear panel, the retaining bracket comprising a pressing body and at least one operating arm received in the at least one opening;
    wherein when the at least one operating arm is operated, the pressing body of the retaining bracket is movable between a position retaining the slot cover and a position releasing the slot cover.

10. The retaining device as claimed in claim 9, wherein the rear panel comprises a first plate and a second plate extending from the first plate, the second plate defines a pair of first openings in respective opposite end portions thereof, and the retaining bracket comprises a pair of operating arms detachably engaging in the first openings respectively.

11. The retaining device as claimed in claim 9, wherein a plurality of evenly spaced notches is defined in a longitudinal edge portion of the pressing body of the retaining bracket, for engagingly receiving corresponding cards therein.

12. The retaining device as claimed in claim 10, wherein the second plate defines a pair of second openings respectively below the first openings, a pair of protrusions is inwardly formed at respective opposite sides of each of the second openings, each of the protrusions defines a hole therein, a pair of pivots is formed at each of junctions of the pressing body and the operating arms, and the pivots are pivotably engaged in the holes.

13. The retaining device as claimed in claim 11, wherein the operating arms each comprise a pair of support bars extending from an edge of the pressing body, and an arcuate portion extending from free ends of the support bars upwardly and generally away from the longitudinal edge portion.

14. The retaining device as claimed in claim 13, wherein a pressing portion is formed at an end of the arcuate portion, and projects.

15. The retaining device as claimed in claim 14, wherein a stepped locking detent is formed at a distal end of the pressing portion.

16. A retention device assembly comprising:

a rear panel defining an elongated platform extending along a first direction;

a plurality of expansion card covers having end portions seated upon said platform;

a retaining bracket constantly pivotally mounted on the rear panel, said bracket including an elongated pressing body adapted to abut against the platform with said end portions of the card covers being sandwiched therebetween when said retaining bracket is in a locking position, and at least one deflectable operation arm with a locking device thereon for engagement with the rear panel when said retaining bracket is in the locking position and for disengagement from the rear panel when said retaining bracket is in a release position; wherein said rear panel constantly holds the retaining bracket regardless of whether said bracket is in the locking position or the releasing position.

17. The assembly as claimed in claim 16, wherein said operation arm is spaced from said pressing body to provide resiliency thereof.

18. The assembly as claimed in claim 16, wherein said bracket is rotated about an axis along said first direction, and a force applied unto the operating arm in a second direction, which is perpendicular to the first direction, is used for releasing.

* * * * *